United States Patent
Yializis

Patent Number: 6,106,627
Date of Patent: *Aug. 22, 2000

[54] APPARATUS FOR PRODUCING METAL COATED POLYMERS

[75] Inventor: Angelo Yializis, Tucson, Ariz.

[73] Assignee: Sigma Laboratories of Arizona, Inc., Tucson, Ariz.

[*] Notice: This patent issued on a continued prosecution application filed under 37 CFR 1.53(d), and is subject to the twenty year patent term provisions of 35 U.S.C. 154(a)(2).

[21] Appl. No.: 08/628,030

[22] Filed: Apr. 4, 1996

[51] Int. Cl.[7] .......................... C23C 16/00; C23C 14/00; B05C 1/00

[52] U.S. Cl. .................. 118/724; 118/50; 118/69; 118/202; 118/244; 427/259; 427/264; 427/270; 427/271; 427/385.5; 427/404; 427/407.1; 427/487; 427/532; 427/555; 427/559

[58] Field of Search ..................... 427/487, 532, 427/559, 555, 385.5, 404, 407.1, 259, 264, 270, 271; 118/724, 69, 202, 50, 244

[56] References Cited

U.S. PATENT DOCUMENTS

| | | | |
|---|---|---|---|
| 4,490,774 | 12/1984 | Olson et al. | 361/311 |
| 4,499,520 | 2/1985 | Cichanowski | 361/311 |
| 4,513,349 | 4/1985 | Olson et al. | 361/311 |
| 4,515,931 | 5/1985 | Olson et al. | 526/323 |
| 4,533,710 | 8/1985 | Olson et al. | 526/323 |
| 4,882,200 | 11/1989 | Liu et al. | 427/555 |
| 5,018,048 | 5/1991 | Shaw et al. | 361/323 |
| 5,097,800 | 3/1992 | Shaw et al. | 551/645 |
| 5,593,723 | 1/1997 | Kitaori et al. | 427/132 |

*Primary Examiner*—Bernard Pianalto
*Attorney, Agent, or Firm*—Benman & Collins

[57] ABSTRACT

A method of improving the breakdown strength of polymer multi-layer (PML) capacitors is provided and of providing a window in food packaging is provided. The method comprises patterning the aluminum coating, either by selective removal of deposited aluminum or by preventing deposition of the aluminum on selected areas of the underlying polymer film. Apparatus is also provided for patterning metal deposition on polymer films comprising masking for defining regions in which metal is deposited. The apparatus comprises: (a) a rotating drum; (b) a monomer evaporator for depositing a monomer film on the rotating drum; (c) a radiation curing element for curing the monomer film to form a cross-linked polymer film; and (d) a resistive evaporator for depositing a metal film on the cross-linked polymer film. The foregoing elements are enclosed in a vacuum chamber. The masking comprising one of the following: (e1) a web mask provided with openings for depositing the metal film therethrough, the web mask including a portion adapted for positioning between the resistive evaporator for depositing the metal film on the cross-linked polymer film and the rotating drum; or (e2) a rotating element for transferring liquid from a source to the rotating drum, the rotating element adapted to transfer the liquid to the rotating drum after the monomer evaporator for depositing the polymer film and before the resistive evaporator for depositing the metal film.

8 Claims, 4 Drawing Sheets

APPARATUS FOR PRODUCING METAL COATED POLYMERS

TECHNICAL FIELD

The present invention relates generally to metal-coated thin film polymers, and, more particularly, to hybrid thin films comprising a polymer film coated on one or both sides with a vacuum-deposited, radiation-cured acrylate polymer in turn coated with a patterned, metallized film. The hybrid thin films employed in the practice of the invention are useful, for example, in metallized film capacitors and metallized films for food packaging applications.

BACKGROUND ART

Thin polymer films find extensive use in many areas. Capacitors employ low temperature thermoplastic dielectric thin film polymers, such as polypropylene (PP), polyethylene terephthalate (PET), polycarbonate, polyethylene-2,6-naphthalate, polyvinylidene difluoride (PVDF), polyphenylene oxide, and polyphenylene sulfide, either metallized or maintained between metal foil electrodes. Food packaging employs metallized polymer films, such as PP and PET, as a moisture barrier.

A monolithic capacitor is one in which the layers of electrodes and dielectric are bonded together in a unitary structure as opposed, for example, to a metallized film capacitor in which self-supporting films are rolled or wound into the capacitor form. A miniaturized capacitor is one of very small dimensions, so as to be suitable for microcircuitry.

Small overall size could denote low capacitance of little practical value, except that the thickness of the intervening dielectric layer inversely affects the capacitance between adjacent electrodes, and the number of electrode pairs directly affects capacitance. Therefore, as a matter of basic capacitor theory, a capacitor having very thin dielectric layers and many pairs of electrodes could have substantial capacitance despite being of miniature size, with the active area of the electrodes being quite small.

Metallized film capacitors are used extensively in a broad range of electrical and electronic equipment that include motor run and motor start circuits for air conditioners, fluorescent and high intensity light ballasts, power supplies, telecommunication equipment, instrumentation, and medical electronics. In many of these applications, the metallized capacitors are used to conserve energy by correcting the power factor of a circuit and in others they are used to perform specific functions, such as timing, filtering, and de-coupling. The advantages of metallized film over film foil capacitors include lower volume, weight, cost, and higher reliability due to the self-healing properties of the metallized films. The metallized polymer film dielectrics find use in such a multitude of high voltage and high frequency capacitor applications due to their low dielectric loss.

Such a miniaturized capacitor is disclosed and claimed in U.S. Pat. No. 5,018,048, issued May 21, 1991, to D. G. Shaw et al. While that capacitor is fine for its intended purpose, it tends to have a low breakdown strength, on the order of 150 Volts (V), compared to a theoretically possible higher breakdown strength on the order of 500 to 1000 V, depending on the configuration. The cause of the lower breakdown voltage appears to reside in exposed edges that arc over with increasing applied voltage.

Thus, a method of increasing the breakdown strength of miniaturized monolithic multi-layer capacitors is required.

With regard to food packaging, aluminum-coated thermoplastic polymer films are used to keep food fresh by acting as a barrier to air and water vapor. However, the aluminum film prevents visual inspection of the contents of the food package by the consumer. Market research has shown that consumers prefer to see inside the food package and view the condition of the contents.

Thus, a method of providing a window in food packaging is desired.

DISCLOSURE OF INVENTION

A method of improving the breakdown strength of polymer multi-layer (PML) capacitors is provided and of providing a window in food packaging is provided. The method comprises patterning the aluminum, or other metal, coating, either by selective removal of deposited aluminum or by preventing deposition of the aluminum on selected areas of the underlying polymer film.

Apparatus is also provided for patterning metal deposition on polymer films comprising masking for defining regions in which metal is deposited. The apparatus comprises: (a) a rotating drum; (b) means for depositing a monomer film on the rotating drum; (c) means for curing the monomer film to form a cross-linked polymer film; and (d) means for depositing a metal film on the cross-linked polymer film. The foregoing elements are enclosed in a vacuum chamber. The masking comprising one of the following: (e1) a web mask provided with openings for depositing the metal film therethrough, the web mask including a portion adapted for positioning between the means for depositing the metal film on the cross-linked polymer film and the rotating drum; or (e2) a rotating element for transferring liquid from a source to the rotating drum, the rotating element adapted to transfer the liquid to the rotating drum after the means for depositing the polymer film and before the means for depositing the metal film.

BEST MODES FOR CARRYING OUT THE INVENTION

Figure 1:
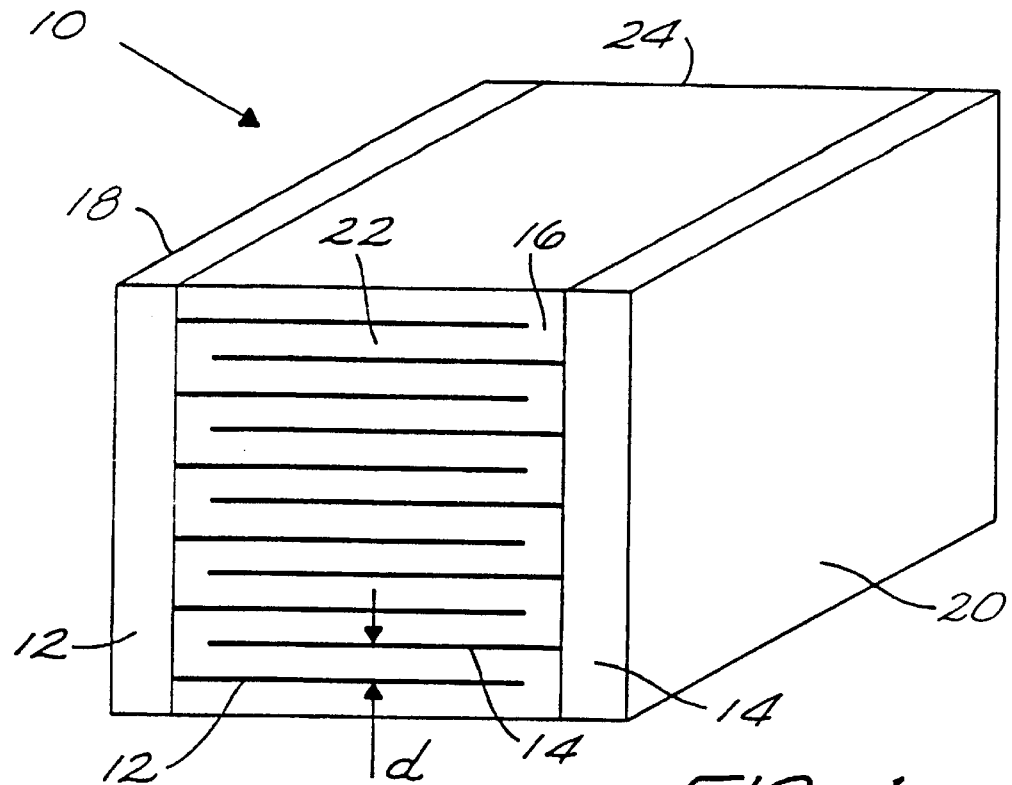
FIG. 1 is an enlarged view in perspective of one form of a capacitor benefited by the method of the present invention.

Referring now to the drawings wherein like numerals denote like elements throughout, FIG. 1 shows a capacitor 10 comprising two sets of interleaved electrodes 12, 14, separated by a dielectric 16. Each set of electrodes 12, 14 terminates in a common solder termination strip 18, 20, respectively, for connection into an electrical circuit (not shown).

The electrodes 12, 14 are separated by a distance d, typically about 1 µm, although the distance may be smaller or larger, depending on the particular design of the capacitor 10. The electrodes 12, 14 may comprise any of the metals commonly employed in capacitor design; however, since aluminum is generally used, it is preferred. The aluminum electrodes are about 50 to 500 Ångstrom (Å) thick.

The solder termination strips 18, 20 comprise a metal which is readily solderable, such as copper. The polymer dielectric comprises a cured polymer, i.e., radiation-curable resin, capable of adhering or bonding to the electrode material. Useful resins are polyfunctional acrylics, and mixtures thereof, such as disclosed in U.S. Pat. Nos. 4,499,520; 4,490,774; 4,533,710; 4,513,349; and 4,515,931. The specific dielectric materials are thus well-known and do not form a part of the present invention.

As will be apparent from the dimensions given, even a miniature capacitor of this design which is less than 1 inch square in the outer periphery and a few millimeters thick can embody many alternate electrode 12, 14 and dielectric 16 layers, up to 1,000 or more. The result is a capacitor that is effective at up to 50 Volts (V) with a capacitance in the 0.001 to 100 or more micro-Farad (µF) range, depending, of course, upon overall size and the number of electrode pairs.

The dielectric coatings 16 space and separate the conductive layers 12, 14 which, as described above, are uniformly interleaved in stacked electrically isolated relation. The fabrication of the thin film capacitor 10 is described elsewhere; see, e.g., U.S. Pat. Nos. 5,018,048 and 5,097,800. Briefly, capacitors like the capacitor 10 are simultaneously formed in large numbers by depositing electrode material 12, 14 and dielectric 16 in strips.

The conductive layers 12, 14 and dielectric coatings 16 are built up in the number desired by causing successive passes to be made relative to the depositing systems. The resulting structure is then sliced to form individual strips, which are then in turn sliced to form the individual capacitors 10. Solder termination strips 18, 20 are then added along the faces formed by cutting along lines 30. Leads (not shown) are added to the solder termination strips 18, 20, and the device 10 is encapsulated.

Figure 2:
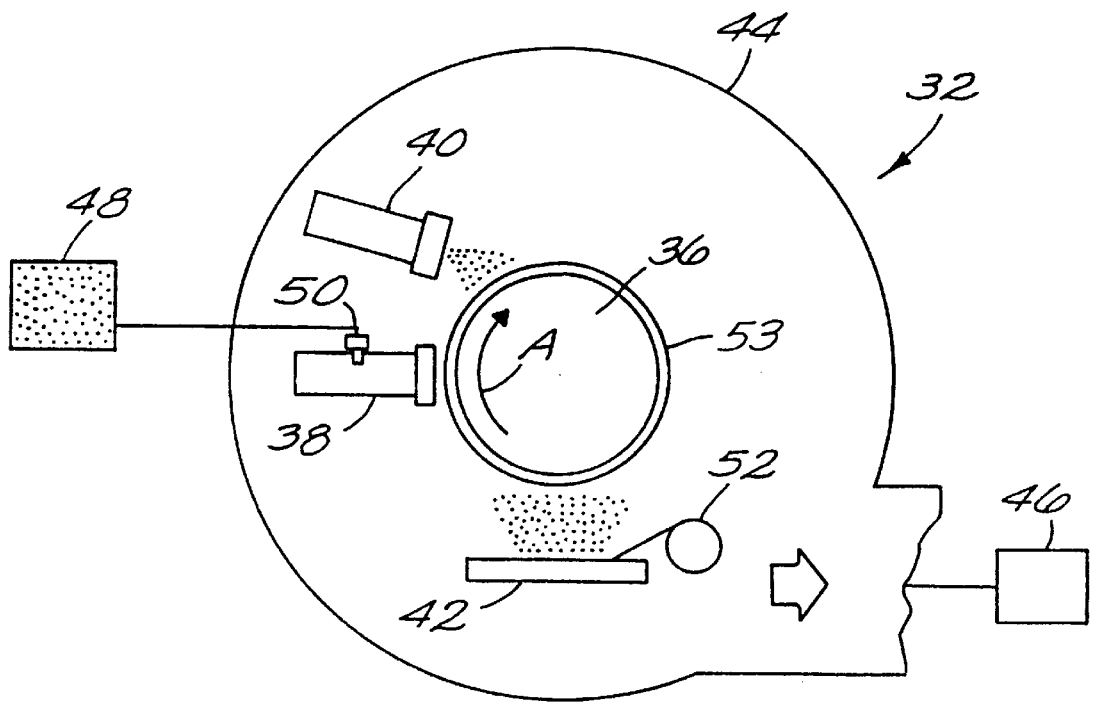
FIG. 2 is a schematic representation of high speed polymer deposition equipment used to produce the polymer monolithic capacitors of FIG. 1, as well as metallized food packaging film.

The polymer deposition process is a one-step continuous process and is shown schematically in FIG. 2, employing apparatus 32 as an example. Briefly, the process starts by depositing a reactive acrylate monomer film directly on the surface of a rotating drum 36 which rotates in the direction shown by the arrow "A" after application of a suitable thin release coating (not shown), from a monomer source 38. Alternatively, the monomer film can be deposited on a suitable carrier film, such as polypropylene or polyester.

The monomer film moves under an electron beam generated by an electron gun 40 where it is cross-linked to form the dielectric coatings 16. A metal layer (not shown) can be deposited on the cross-linked layer. The metal layers 12, 14 are deposited on the cross-linked film 16 from a metal evaporator 42, as described in the patents referenced above; the metal layers are interleaved with the cross-linked film as shown in FIG. 1.

The cured acrylate monomer, or cross-linked polymer, then passes to the resistive evaporation system 42, where an inorganic material, such as aluminum or zinc, is deposited on the cured monomer layer. The resistive evaporation system 42 is commonly employed in the art for metallizing films. Alternatively, other metal deposition systems, such as a conventional electron beam vaporization device, may be employed. The resistive evaporation system 42 is continually provided with a source of metal from the wire feed 52.

If the application necessitates a flat or a curved (in the cross-machine direction, CMD) surface, the multilayer structure is heated under light pressure after removal from the drum 36. This process permanently flattens (or curves) the panels and it also helps to relieve internal stresses that tend to curl the stacks (that have thicknesses of about 1 mm or more) in the direction of the drum.

It is desired to pattern the metal deposited so that in the case of capacitors, metal is avoided near the exposed edges of the electrodes in order to increase the breakdown strength. In the case of food packaging, a transparent window is provided so that the consumer can visually inspect the contents of the package.

There are a variety of ways to pattern the metal, including removal of the metal from selected areas (e.g., laser patterning) and masking (e.g., shadow mask, liquid print mask, vapor evaporation and liquid transfer mask, and vapor jet). These techniques are described below, and are suitable for the production of both PML capacitors and food packaging.

A. Laser Patterning

1. Single Metal Layer on a Polymer Film Substrate.

Samples of aluminized polyester film were sent to a variety of facilities to test demetallization processes using laser ablation to remove metal from selected regions. Some samples were returned with uniformly excellent results, using Nd:YAG lasers to draw lines typically 0.1 to 1 mm wide. The polymer film substrate was transparent to the 1 µm radiation used, so energy absorption ended when the metal was removed, thereby effectively self-limiting the substrate damage. Linear demetallization rates ranged from 14 to 80 inches per second, with the top speed limited by servomechanisms, rather than ablation rates. Much higher linear rates are possible with redesigned mechanical systems. Laser powers used ranged from 2 to 60 W.

Some samples were tested to determine the surface breakdown voltage. Electrical contact was made and DC voltage was applied in 100 V increments. In one case, the ablated portions of the metallized film (sample A) 0.1 mm wide held voltages up to 700 V and did break down at 800 V. Two additional samples were measured (samples B and C, 100 µm and 50 µm wide lines, respectively). Sample B held with no arcing until 500 V. The line was not completely destroyed and portions of the ablated regions held 1000 V. Sample C had an initial arc at 600 V, which started a chain reaction "unzipping" along the ablated line.

The high voltage of the breakdown tests indicate that the breakdown field was near the value for breakdown in air, indicating that the surface was clean and free of any conducting residues. With designed clear regions 1 mm wide at the edge of the defibrillator capacitors, this breakdown voltage is clearly sufficient for the 850 V operating voltages required.

Laser ablation is also useful for removing selected portions of metallized film, such as acrylate-coated alumized polypropylene, to provide windows in food packaging film to allow visual inspection of the contents.

In addition, printing plates using a metallized coating and provided with a plurality of openings or vias arranged in an image pattern, which are capable of holding a quantity of ink for transfer to a print medium, are beneficially prepared by selective laser ablation of a metal, e.g., aluminum, layer on a carrier, such as 1 mil polyester, coated with an acrylate. In this embodiment, portions of the acrylate layer are selectively removed to form a negative for printing. The laser melts the underlying metal, which ablates and blasts a hole in the acrylate film.

The foregoing process is essentially independent of the metal employed, so long as it is recognized that a higher emissivity metal would require a lower thickness. For example, a high emissivity material, such as titanium or molybdenum, which also has a relatively high melting point, may be employed in a thickness up to about a few hundred Å. A metal having a comparatively moderate emissivity, such as zinc, would require a somewhat thicker layer.

Vacuum may be employed to remove debris formed in the ablation process.

A plurality of printing plates may be so formed for use with different colors in multi-color printing.

2. Polymer/Metal Multilayer Systems.

Hexane diol diacrylate (HDODA)/Al multilayer samples were sent to a variety of facilities to test the interaction of laser light with multiple layers of polymer and metal and to remove selected portions of metal in order to improve dielectric of PML capacitors. These samples explore the issues of laser light striking embedded aluminum layers if the top metal layer is ablated away. During the laser patterning of the final product capacitors, it is expected that there will be a negligible amount of aluminum in the laser path through the polymer. The purpose of this test was to evaluate what might happen if there is some aluminum in the polymer matrix that by mischance encounters laser light.

The samples sent out for evaluation included multilayer samples that had metal as the top surface and those with polymers as the top surface. The results reported below are for the samples with metal as the top layer, although the results on samples with polymer as the top layer were very similar, especially at high laser powers.

At all laser powers, the top metal layer was completely ablated away. At higher laser power, the samples were ablated several layers deep. Under optical and SEM microscopy, channels cut in the multilayer using a high laser power were observed. The channels were approximately 0.5 mm wide, approxomating the laser beam diameter. Close inspection revealed that the laser beam can demetallized the top metal layer and then pass through the polymer layer and demetallize the layer bellow. The energy created by the evaporation of the second layer causes the polymer layer "explode", thus creating a small hole. Depending on the laser power, this process can extend several or more layers into the multilayer stack.

At lower power, the top metal layer was completely removed. Under optical and SEM microscopy, there was observed a broad expanse of surface that had only one layer of metal removed, without removing any polymer layer. The expanse of demetallized polymer indicates a broad power density window that performs the metal removal without affecting the underlayers.

The laser demetallization results can be summarized as follows:

A metallized polymer film web can be demetallized selectively with the use of a laser. The process speed depends on the power density of the laser beam (laser power and beam diameter).

In a multilayer polymer-metal structure, if the top layer is a metal layer, it can be demetallized by selecting the appropriate laser power.

In a polymer-metal structure, if the top layer is a polymer layer, a laser can be used to demetallize the metal layer below the polymer layer. This will create a small hole in the polymer layer. If the multilayer structure has many polymer-metal pairs, higher laser powers can ablate several metal layers, thus creating a deeper hole. This process can have applications in the printing industry, where the small holes on a film surface can be used to create printing negatives for ink transfer.

B. Continuous Web Shadow Mask

Figure 3:
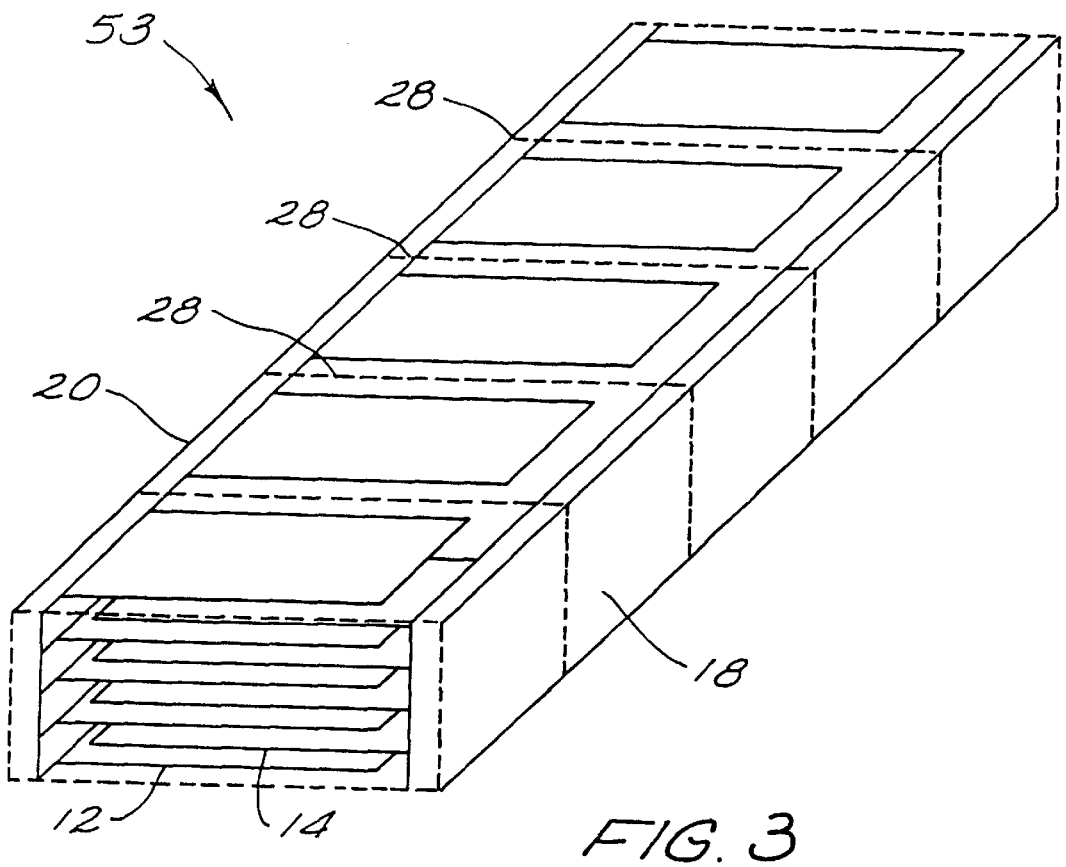
FIG. 3 is a schematic diagram of a patterned capacitor strip, intended to limit edge effects.

As indicated above, the edge leakage effect is caused by cross-cuts 28 on the PML strip which expose the electrodes 12, 14 as shown in FIG. 3. Since breakdown is much more prevalent along a surface, the exposed edge 22, 24 has been the limiting factor in previous capacitors. Covering the surface with an additional deposition layer can help to some extent, but the interface still remains as the electrical weak point.

As also indicated above, the solution to the edge leakage problem is to eliminate the metal electrode from the capacitor edge. The laser ablation approach discussed above is one way to accomplish this. Another way is to add additional masking capabilities, such as a continuous web, so that all cross-cut saw cuts 28 can be made in polymer 16 only. FIG. 3 illustrates a schematic diagram of a patterned capacitor strip portion 53 intended to limit the edge effect. The electrode 12, 14 is patterned so that the cross-cut saw cuts are made only in the region of polymer 16.

Figure 4:
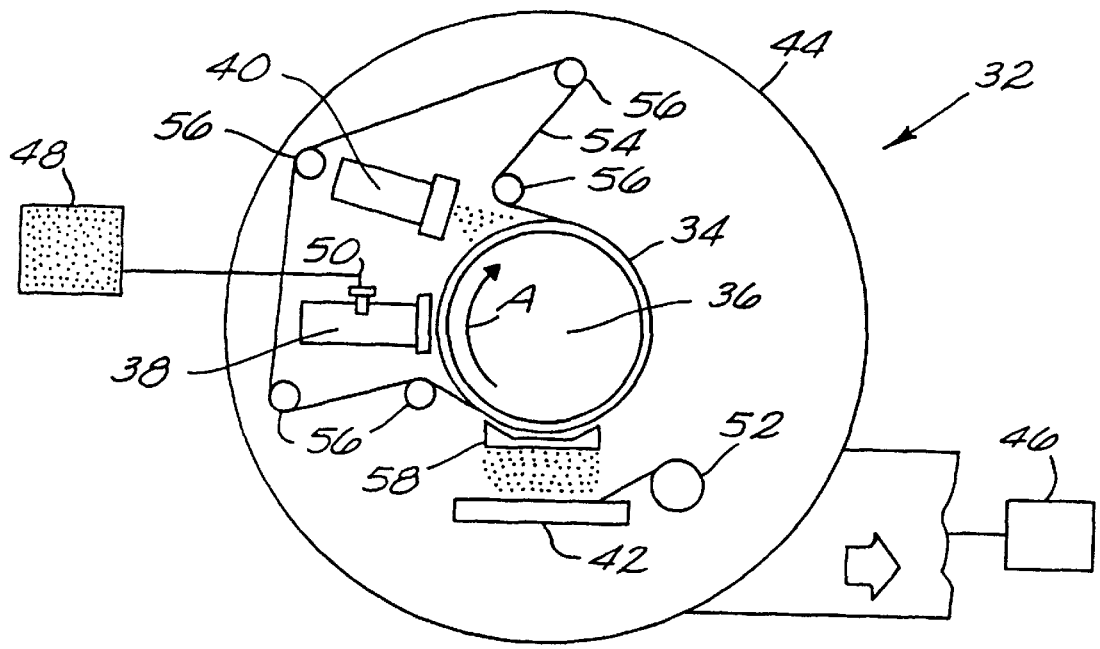
FIG. 4 is depicts apparatus similar to that shown in FIG. 2, except that a shadow mask is illustrated as one embodiment for masking deposition of metal onto polymer layers.

Referring now to FIG. 4, the continuous web concept embodies a flexible mask 54 that is in contact with the deposition surface of the main drum 36 when the aluminum 12, 14 is deposited and is removed when the monomer layer 16 is deposited and cured. Holes (not shown) cut into the flexible shadow mask 54 allow metal patterns to be deposited through the mask onto the surface of the main drum 36. In one particular embodiment, the mask 54 was a continuous loop of 10 mil polyester, 12 inches wide and about 14 feet long. Simple 1 inch×2 inch square holes were cut into the mask to provide a test deposition pattern. The existing web handling system is designed for a batch process with wind and rewind rolls rather than a continuous loop. Additional rollers 56 were designed and installed to close the web loop and to appropriately tension the continuous loop web mask 54.

Because it is a continuous web, the rollers 56 had to be carefully realigned to prevent the mask 54 from creeping to the edge of the web handling rollers. The rollers are all independently fastened to the door of the chamber and even though the chamber door is extremely massive, the alignment while the chamber is open is different than the alignment when the chamber is under vacuum. Even if the web would run almost perfectly while the chamber was open, putting the chamber under vacuum stressed the door and the roller supports enough to immediately run the web mask to the very edge of the rollers. One solution to this problem is to install rails (not shown) to guide the edge of the film. Another solution, more suitable for production runs, is a gantry support system, combined with sprocketed web handling (not shown).

The shadow mask 54 provides masking in the cross-machine direction (CMD). A separate metal mask 58 provides masking in the machine direction, perpendicular to the CMD masking.

It will be appreciated that shadow masking is useful in providing windows in metallized food packaging film.

C. Liquid Print Masking

Figure 5:
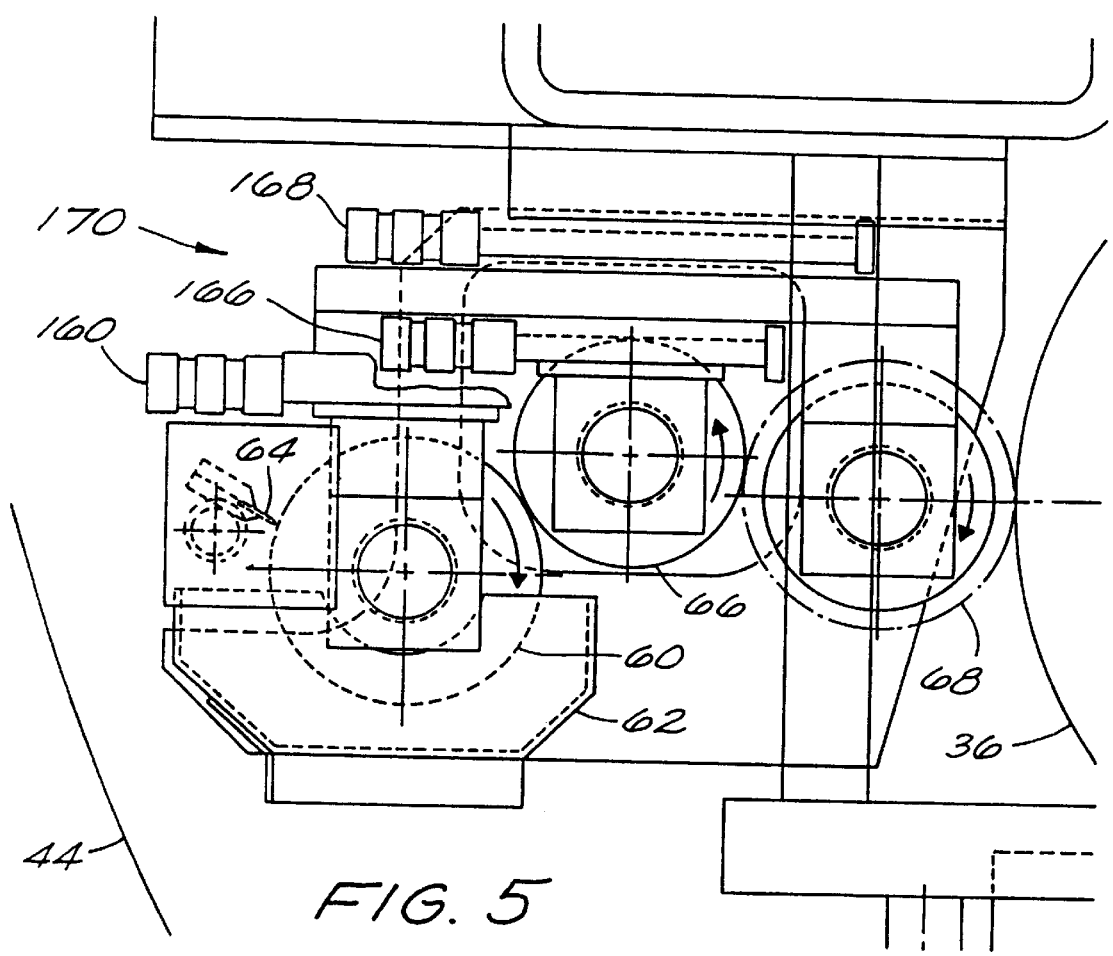
FIG. 5 depicts apparatus directed to another embodiment of the present invention, employing a liquid print mask, deposited by transfer from liquid in a holding tank; this masking system can be used both for multilayer capacitors as well as masking of aluminum on a moving web, for other applications such metallized films for food packaging.

The liquid print masking technique utilizes the low sticking coefficient of metal atoms on a liquid surface. A thin film of liquid on a surface will considerably reduce any metal deposition. By patterning the thin liquid film, the metal deposition can be patterned. The liquid is printed on the surface of the main drum using technology similar to conventional offset gravure printing. The configuration of the system is illustrated in FIG. 5. A finely engraved anilox roller 60 picks up liquid from a pan 62. The liquid is metered by the doctor blade 64, which removes all the liquid that is not in the engraved grooves (not shown) in the anilox roller 60. The liquid is picked up from the anilox roller 60 with a rubber transfer roller 66 that smoothes the liquid, obliterating the engraved markings, and transfers the liquid to the print head roller 68. The print head roller 68 is patterned in the shape of the final product capacitors. That pattern is transferred to the surface of the main drum 36.

Each of the three main rollers 60, 66, 68 is mounted on two microslides that allow adjustment of the contact between the rollers. One microslide is depicted for each roller, denoted 160, 166, 168, respectively. The microslides on the print head roller 168 support the microslides for the other two rollers so that the entire assembly 170 can be moved into the main drum 36 without changing the roller-to-roller adjustment. The print head roller microslides are also spring-loaded to provide an adjustable contact with the main drum 36 to allow for out-of-roundness of the main drum and to absorb changing thicknesses as the PML strap is built up. The entire assembly 170 is designed to be driven with a toothed belt from the main axle of the main drum 36.

1. Oil Liquid Print-Mask.

Oil was selected as a candidate for the printing liquid (ink), primarily because of its vacuum compatibility. There are a variety of low viscosity oils that are designed for use in diffusion and other vacuum pumps and so are inherently vacuum compatible.

After a period of adjusting and tuning the printing apparatus, deposited aluminum patterns were successfully produced on a polypropylene substrate web. The aluminum was electrically conductive and adhered well to the polypropylene, passing simple standard tests such as the adhesive tape pull test. Depending in the process conditions, there was some discoloration of the clear region where the aluminum deposition was rejected, but it was not apparent whether it was due to some residual aluminum deposition on the oil or a carbonization due to exposure to the hot aluminum vapor sources. In any event, the clear region was certainly an electrical insulator. These results demonstrate the feasibility of the fundamentals of this approach.

Tests with the oil patterning can be complicated by slippage between the main drum 36 and the print head roller 68. Over-stressing the roller-roller contact forces, the doctor blade-anilox roller contact force, or the print head roller-main drum contact force caused slippage between the main drum and the printing assembly. The slippage can be avoided by adjusting the microslides appropriately, but this practice limits the control over the amount of oil transferred to the drum, since the contact forces control the oil transfer from roller to roller. Another way to avoid slippage is to provide a direct gear drive from the main drum. This was done by attaching a large gear to the side of the process drum, that drove a gear on the printing roller, which drove the transfer roller and anilox rollers.

The direct gear drive allows the print head roller to just barely touch the main drum, but the printing assembly rotation has enough torque from the direct drive to firmly doctor blade any excess oil from the anilox roller. This system resulted in very effective oil printing and aluminum demetallization.

D. Vapor Evaporation and Liquid Transfer Masking System

Figure 6:
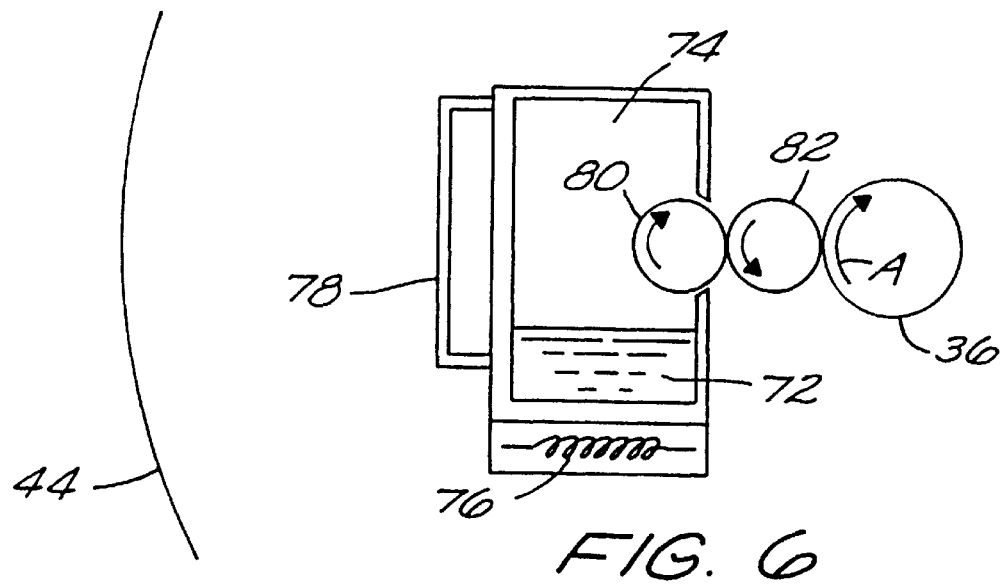
FIG. 6 depicts apparatus directed to yet another embodiment of the present invention, also employing a liquid print mask, deposited by transfer from vaporized liquid.

FIG. 6 illustrates apparatus for use with vapor evaporation and liquid transfer. A suitable liquid 72, such as an oil, is contained in an enclosed chamber 74 provided with a heater 76 for vaporizing the liquid and with a cooling jacket 78 for condensing and recirculating excess vapor. The liquid 72 is heated by the heater 76 to create the vapor. The vapor is picked up by a first roller 80, where it condenses to form a thin film (not shown). The thin film is then transferred to the main drum 36 by a transfer roller 82. The first roller 80 is partially contained in the enclosed chamber 74, as shown, with suitable sealing (not shown) to prevent escape of the vapor, while allowing transfer of the liquid to the transfer roller 82.

The temperature of the heated liquid 72 must not be so high as to create excess pressure, which would cause the vapor to leak out of the chamber 74. This approach utilizes the same oil materials as the direct oil printing method. The major advantage of the vapor to liquid method, is that it allows a thinner layer of oil to be transferred to the printing roller, with much better control of the oil thickness.

E. Vapor Jetting

Figure 7:
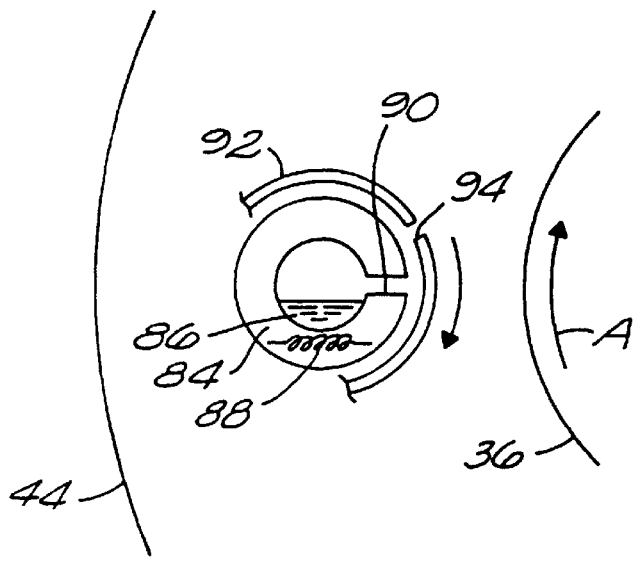
FIG. 7 depicted apparatus directed to still another embodiment of the present invention, also employing a liquid print mask, deposited by jetting vapor of a liquid.

FIG. 7 depicts apparatus for use with the deposition system described above. A stationary, enclosed chamber 84 contains a suitable liquid 86. The chamber 84 is provided with heating means 88, which vaporizes the liquid 86. The chamber 84 is also provided with an output port 90. A rotating mask 92, which rotates around the outside of the chamber 84, is also provided with an opening 94. When the opening 94 of the rotating mask 92 lines up with the output port 90 of the chamber 84 during rotation, a quantity of vapor is emitted by the pressure of the vapor within the chamber and deposited on the rotating drum 36. As above, patterned use of a suitable liquid 86 prevents deposition of aluminum in undesired locations. The oil materials that are compatible with this method are low vapor pressure oils (less than $10^{-5}$ torr) such as those used in diffusion and turbo vacuum pumps.

F. Use of Polymerizable Oils

In some applications such as food packaging, it may be desirable to have little or no oil residue on the packaging film. This may be accomplished by replacing the masking oils described above with a low molecular weight (<1,000) monomer that can be radiation-cured after the masking process. That is, after the deposition of the metal layer, a curing station, similar to 40, can be added to cure any residue of the masking monomer.

Industrial Applicability

The patterning of metal on polymer films, either by selective removal of deposited metal or by preventing deposition of the metal on selected areas of the underlying polymer film, is expected to find use in improving the breakdown strength of polymer multi-layer capacitors and of providing a window in food packaging.

Thus, there have been disclosed apparati and methods of patterning of metal on polymer films, either by selective removal of deposited metal, such as aluminum or zinc, or by preventing deposition of the metal on selected areas of the underlying polymer film. It will be readily apparent to those skilled in this art that various changes and modifications of an obvious nature may be made, and all such changes and modifications are considered to fall within the scope of the present invention, as defined by the appended claims.

What is claimed is:

1. Apparatus for patterning metal deposition on multilayer polymer/metal structure or web substrates comprising mask means for defining regions in which metal is deposited, said apparatus comprising:
   (a) a rotating drum;
   (b) means for depositing an organic monomer film on said rotating drum;
   (c) means for radiation-curing said organic monomer film to form a cross-linked polymer film; and
   (d) means for depositing a metal film on said cross-linked polymer film, said rotating drum, said means for depositing said monomer film, said means for radiation curing said organic monomer film, and said means for depositing said metal film enclosed in a vacuum chamber, said apparatus further comprising either:
      (e1) a web mask and a metal mask, both provided with openings for depositing said metal film therethrough, said web mask and said metal mask each including a portion adapted for positioning between said means for depositing said metal film on said cross-linked polymer film and said rotating drum, said web mask permitting deposition of said metal film in selected regions across said rotating drum and said metal mask permitting deposition of said metal film in selected regions in a direction along that of said drum rotation; or
      (e2) a rotating means for transferring liquid from a source to said rotating drum, said rotating means adapted to transfer said liquid to said rotating drum after said means for depositing said polymer film and before said means for depositing said metal film, said rotating means permitting masking of said metal film by said liquid both in a direction along that of said drum rotation and perpendicular thereto.

2. The apparatus of claim 1 wherein said web mask comprises a first shadow mask providing masking in a first direction across said rotating drum and a second, separate mask providing masking in a second direction perpendicular to said first direction.

3. The apparatus of claim 1 wherein said rotating means comprises a plurality of rollers: a first, finely engraved anilox roller adapted to pick up said liquid from said source, a transfer roller for picking up said liquid from said anilox roller and smoothing said liquid, and a print head roller patterned in a pre-selected pattern for picking up said liquid from said transfer roller and transferring said liquid to said rotating drum in said pre-selected pattern.

4. The apparatus of claim 3 wherein said liquid is an oil having a low enough viscosity to withstand vacuum pressures in the range of about $1 \times 10^{-5}$ to 1 millibar without significant vaporization.

5. The apparatus of claim 1 wherein said rotating means comprises a plurality of rollers: (a) a first roller partially located in said source, said source comprising an enclosed chamber containing said liquid and provided with (1) heating means to heat said liquid to vapor and (2) cooling means to condense said vapor to said liquid, said first roller adapted to pick up said vapor and condense it to form a thin film thereon; and (b) a second roller for transferring said thin film to said rotating drum.

6. The apparatus of claim 5 wherein said liquid is an oil.

7. The apparatus of claim 1 wherein said rotating means comprises a rotating mask provided with at least one opening, said rotating mask adapted to rotate about said source, said source comprising an enclosed chamber containing said liquid and provided with heating means for heating said liquid to vapor, said enclosed chamber further provided with an output port directed at said rotating drum, such that when opening in said rotating mask is aligned with said output port, a quantity of said vapor is emitted by its pressure toward said rotating drum.

8. The apparatus of claim 1 wherein said liquid is a monomer having a molecular weight of less than 1,000 and capable of being radiation-cured.

* * * * *